(12) United States Patent
Takatsuka et al.

(10) Patent No.: US 8,908,374 B2
(45) Date of Patent: Dec. 9, 2014

(54) ELECTRONIC DEVICE AND POWER CONVERTER PROVIDED WITH ELECTRONIC DEVICE

(75) Inventors: Yushi Takatsuka, Kitakyushu (JP); Akira Souma, Kitakyushu (JP); Katsushi Terazono, Kitakyushu (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 335 days.

(21) Appl. No.: 13/400,118

(22) Filed: Feb. 20, 2012

(65) Prior Publication Data

US 2012/0287576 A1 Nov. 15, 2012

(30) Foreign Application Priority Data

May 13, 2011 (JP) ................................. 2011-108277

(51) Int. Cl.
  *H05K 7/20* (2006.01)
  *H02M 7/00* (2006.01)
(52) U.S. Cl.
  CPC ............... *H05K 7/209* (2013.01); *H02M 7/003* (2013.01)
  USPC ..................... 361/704; 361/679.54; 174/252
(58) Field of Classification Search
  None
  See application file for complete search history.

(56) References Cited

U.S. PATENT DOCUMENTS

| 5,111,169 | A | * | 5/1992 | Ikeda | ............................. | 333/181 |
| 8,630,092 | B2 | * | 1/2014 | Kluge | ........................... | 361/713 |
| 2006/0162958 | A1 | * | 7/2006 | Miya et al. | .................... | 174/255 |
| 2009/0078456 | A1 | * | 3/2009 | Macropoulos et al. | ........ | 174/261 |
| 2009/0145637 | A1 | * | 6/2009 | Kanouda et al. | .............. | 174/255 |
| 2010/0066325 | A1 | * | 3/2010 | Shionoiri | ....................... | 323/282 |
| 2010/0073832 | A1 | * | 3/2010 | Chung et al. | .................... | 361/42 |

FOREIGN PATENT DOCUMENTS

JP 2006-060928 3/2006
JP 2010-167871 8/2010

OTHER PUBLICATIONS

Japanese Office Action for corresponding JP Application No. 2011-108277, Jun. 11, 2013.
Japanese Decision of Rejection for corresponding JP Application No. 2011-108277, Sep. 10, 2013.
Chinese Office Action for corresponding CN Application No. 201210048562.4, Aug. 22, 2014.

* cited by examiner

*Primary Examiner* — Courtney Smith
(74) *Attorney, Agent, or Firm* — Mori & Ward, LLP

(57) ABSTRACT

This electronic device includes a filter circuit including a coil, a resistor, and a condenser, and a heat radiating member radiating heat generated from the coil and the resistor, arranged in proximity to the coil and the resistor of the filter circuit.

17 Claims, 11 Drawing Sheets

ELECTRONIC DEVICE AND POWER CONVERTER PROVIDED WITH ELECTRONIC DEVICE

CROSS-REFERENCE TO RELATED APPLICATIONS

The priority application number JP2011-108277, Electronic Device and Power Converter Provided with Electronic Device, May 13, 2011, Yushi Takatsuka, Akira Souma, Katsushi Terazono, upon which this patent application is based is hereby incorporated by reference.

BACKGROUND OF THE INVENTION

1. Field of the Invention

The present invention relates to an electronic device and a power converter provided with an electronic device, and more particularly, it relates to an electronic device including a filter circuit and a power converter provided with an electronic device.

2. Description of the Background Art

An electronic device including a filter circuit is known in general. Japanese Patent Laying-Open No. 2006-60928 discloses an inverter device and a noise filter device (electronic device) provided between the inverter device and an AC source. The noise filter device disclosed in the aforementioned Japanese Patent Laying-Open No. 2006-60928 includes a first substrate and a second substrate opposed to the first substrate at a prescribed interval. An input terminal portion connected to the AC source and a circuit component such as a condenser constituting a filter circuit are arranged on the upper surface of the first substrate. An output terminal portion connected to the inverter device is provided on the upper surface of the second substrate, and a circuit component such as a condenser constituting a filter circuit is arranged on the lower surface of the second substrate. A coil constituting a filter circuit is arranged at a prescribed interval from the lower surface of the first substrate and the upper surface of the second substrate between the first substrate and the second substrate. The coil is a heat generating component generating heat when the noise filter device operates. In the noise filter device disclosed in the aforementioned Japanese Patent Laying-Open No. 2006-60928, no heat radiating member conducting heat from the coil or the like to actively radiate the heat, arranged in proximity to the heat generating component such as the coil is provided.

SUMMARY OF THE INVENTION

An electronic device according to a first aspect of an embodiment includes a filter circuit including a coil, a resistor, and a condenser and a heat radiating member radiating heat generated from the coil and the resistor, arranged in proximity to the coil and the resistor of the filter circuit.

A power converter provided with an electronic device according to a second aspect of the embodiment includes a power conversion circuit provided with a semiconductor chip containing SiC or GaN and an electronic device arranged in a stage prior to or subsequent to the power conversion circuit, while the electronic device includes a filter circuit including a coil, a resistor, and a condenser and a heat radiating member radiating heat generated from the coil and the resistor, arranged in proximity to the coil and the resistor of the filter circuit.

DESCRIPTION OF THE EMBODIMENTS

An embodiment is now described with reference to the drawings.

First, the structure of a power converter 100 according to the embodiment is described with reference to FIGS. 1 to 9.

Figure 1:
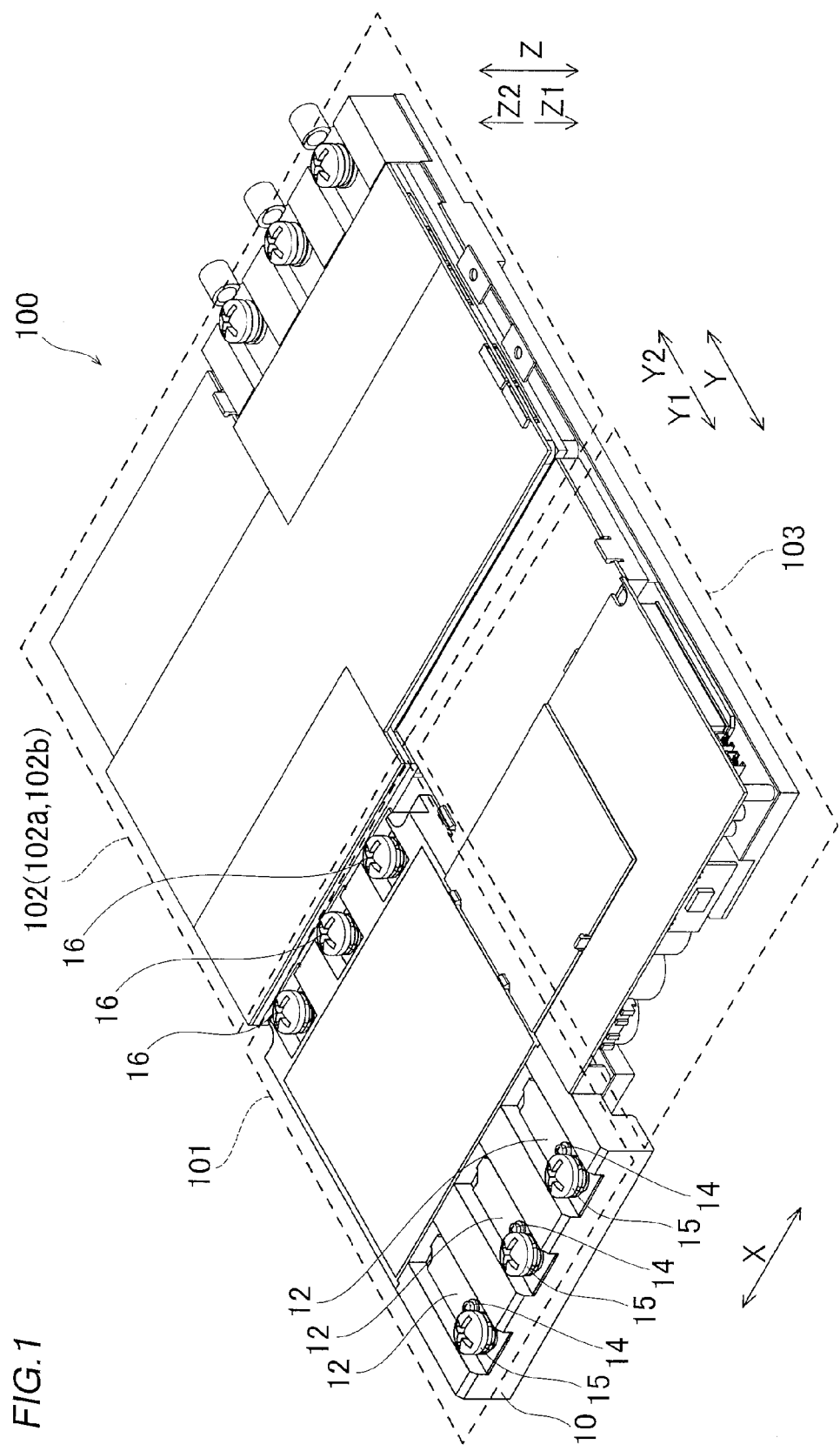
FIG. 1 is a perspective view of a power converter according to an embodiment as viewed from above.

As shown in FIG. 1, the power converter 100 according to the embodiment includes a three-phase filter module 101 (see FIG. 3) and a power conversion circuit 102 having a three-phase converter circuit 102a and a three-phase inverter circuit 102b. The filter module 101 is an example of the "electronic device". The converter circuit 102a and the inverter circuit 102b are examples of the "power conversion circuit".

In the power converter 100, the filter module 101 and the power conversion circuit 102 are arranged adjacent to each other. A power supply circuit 103 or the like supplying power to the power conversion circuit 102 is arranged adjacent to the filter module 101 and the power conversion circuit 102. The overall power converter 100 has a substantially rectangular shape as viewed from above (direction Z1).

The converter circuit 102a and the inverter circuit 102b of the power conversion circuit 102 each include power modules each provided with a semiconductor chip containing SiC (silicon carbide) or GaN (gallium nitride). These power modules speed up a switching operation, whereby the amount of heat generated from the filter module 101 is increased.

Figure 2:
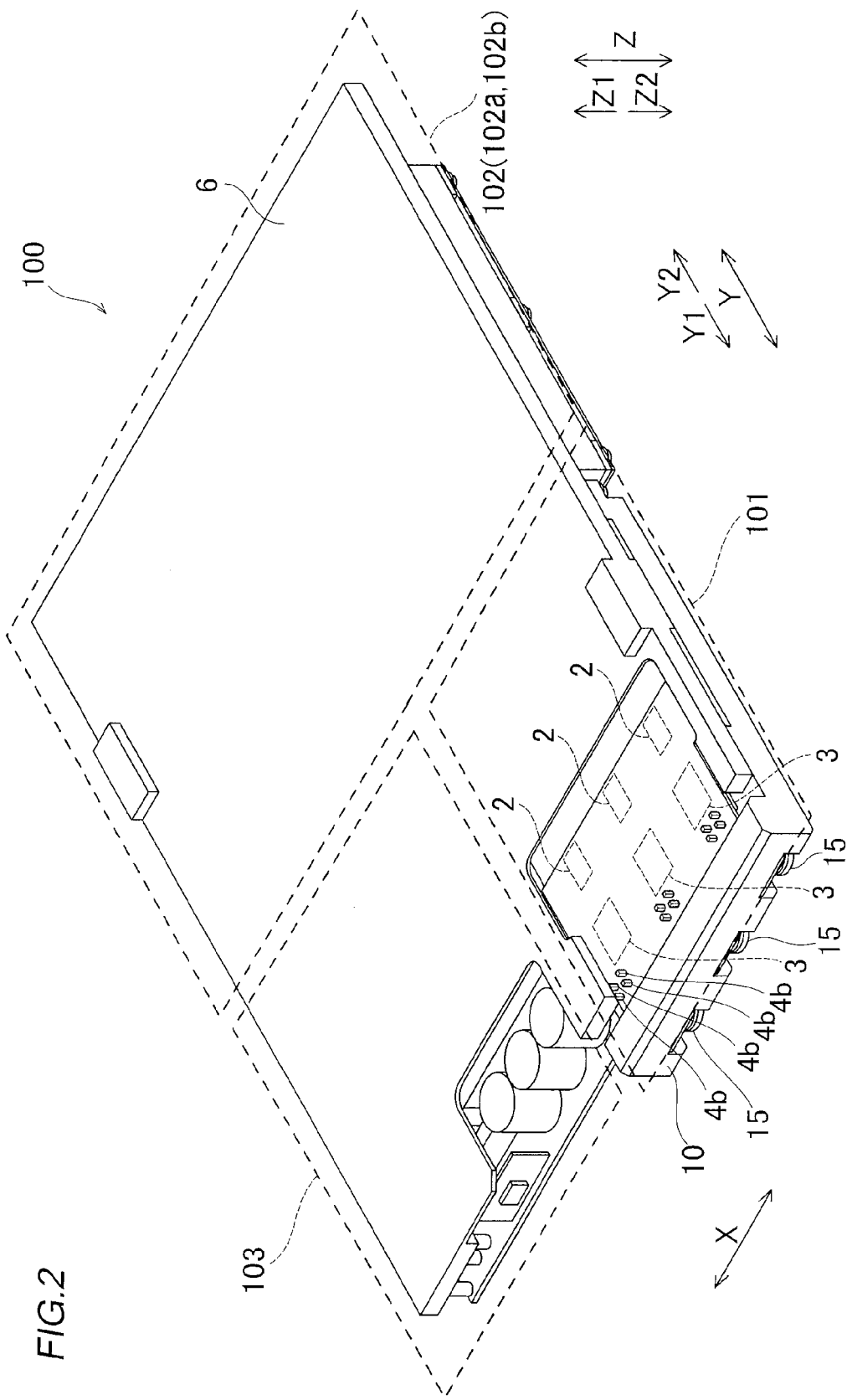
FIG. 2 is a perspective view of the power converter according to the embodiment as viewed from below.
Figure 3:
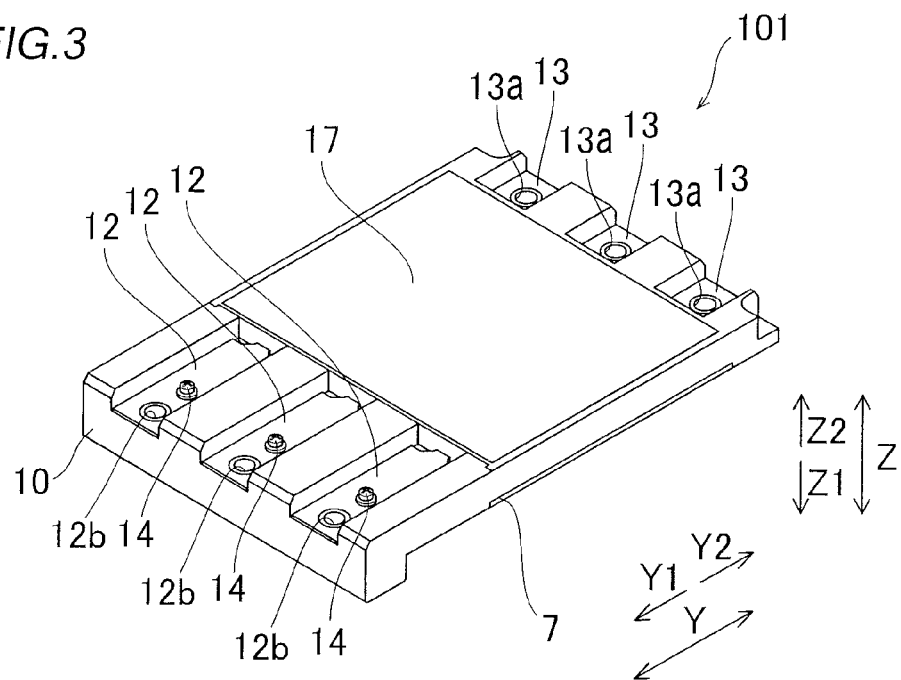
FIG. 3 is a perspective view of a filter module according to the embodiment as viewed from above.

As shown in FIG. 2, a water-cooling type cooling jacket 6 described later to cool heat generated from the filter module 101 and the power conversion circuit 102 is mounted on the rear surfaces of the filter module 101 and the power conversion circuit 102. The cooling jacket 6 is an example of the "cooling portion".

Figure 5:
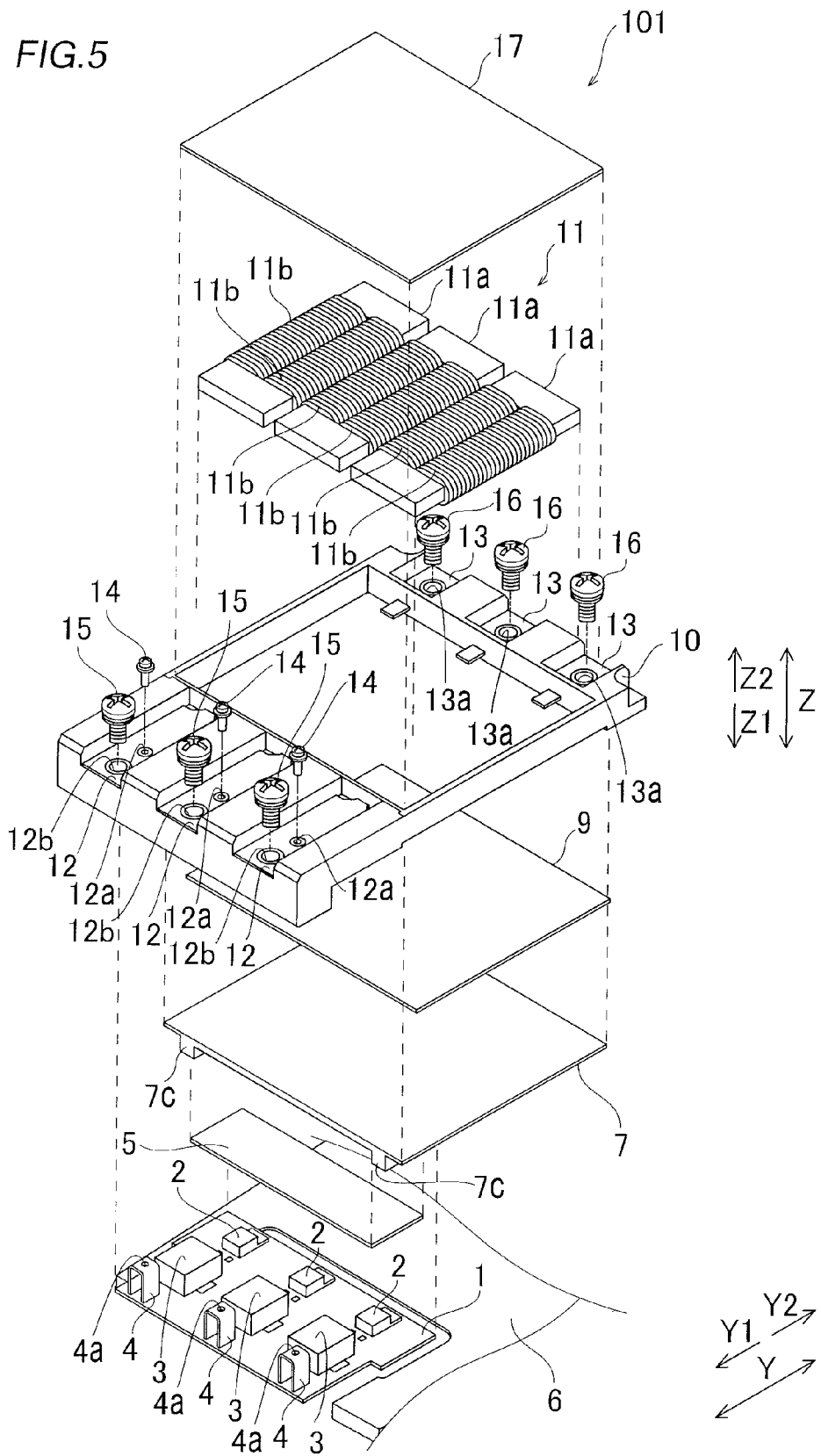
FIG. 5 is an exploded perspective view of the filter module according to the embodiment.

As shown in FIG. 5, the filter module 101 includes a wiring board 1, three resistors 2 and three condensers 3 constituting a filter circuit, three studs 4 made of metal, a thermally conductive sheet 5 containing thermally conductive resin (silicon-based aluminum filler) or the like, and the water-cooling type cooling jacket 6. The filter module 101 further includes a tabular radiator plate 7 made of metal such as copper, heat radiating grease 8 (see FIG. 8), a thermally conductive sheet 9 containing thermally conductive resin (silicon-based aluminum filler) or the like, a frame-shaped case 10 made of resin storing each component, three coils 11 constituting a filter circuit, busbars 12, and busbars 13, screws 14, 15, and 16, and a lid 17.

Figure 4:
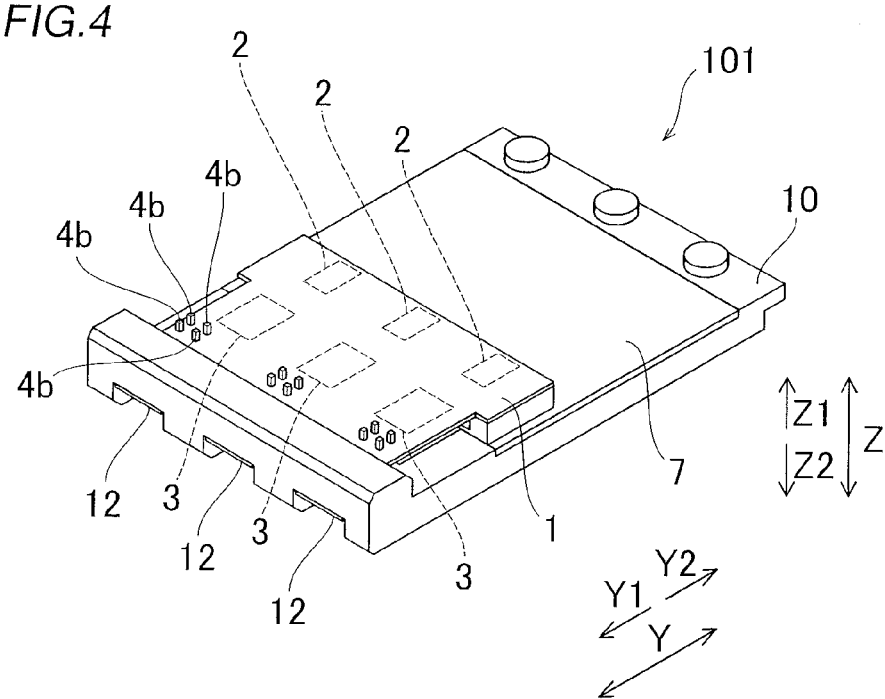
FIG. 4 is a perspective view of the filter module according to the embodiment as viewed from below.
Figure 7:
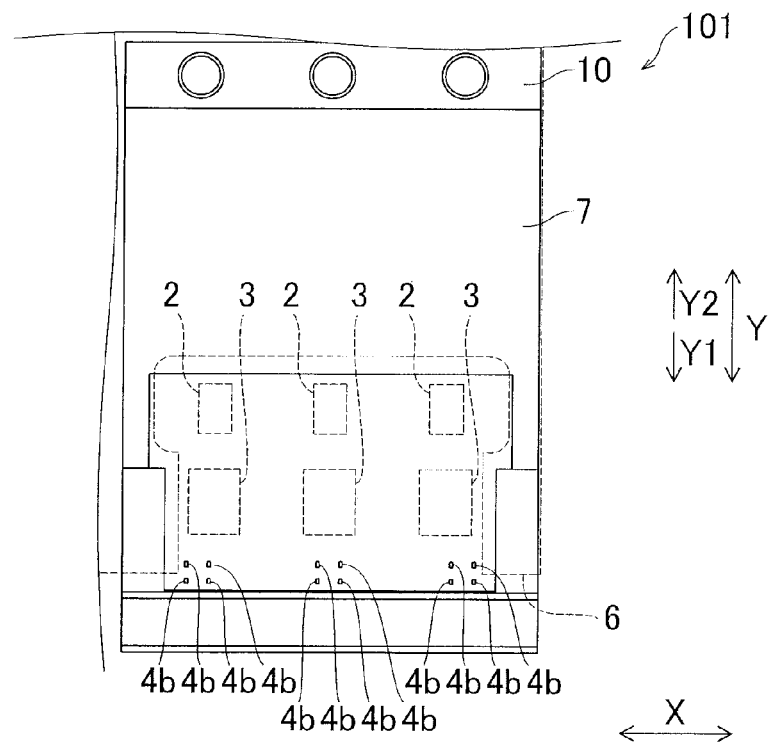
FIG. 7 is a bottom plan view of the filter module according to the embodiment.

The three resistors 2, the three condensers 3, and the three studs 4 are arranged at prescribed intervals on a surface of the wiring board 1. The three studs 4 are U-shaped, and screw holes 4*a* are formed in the upper surfaces (in a direction Z2) of the studs 4. As shown in FIGS. 4 and 7, four connection portions 4*b* are formed on a portion of each stud 4 on the side of the wiring board 1 (in the direction Z1). The four connection portions 4*b* are mounted on the wiring board 1, whereby each stud 4 and the wiring board 1 are electrically connected to each other.

Figure 8:
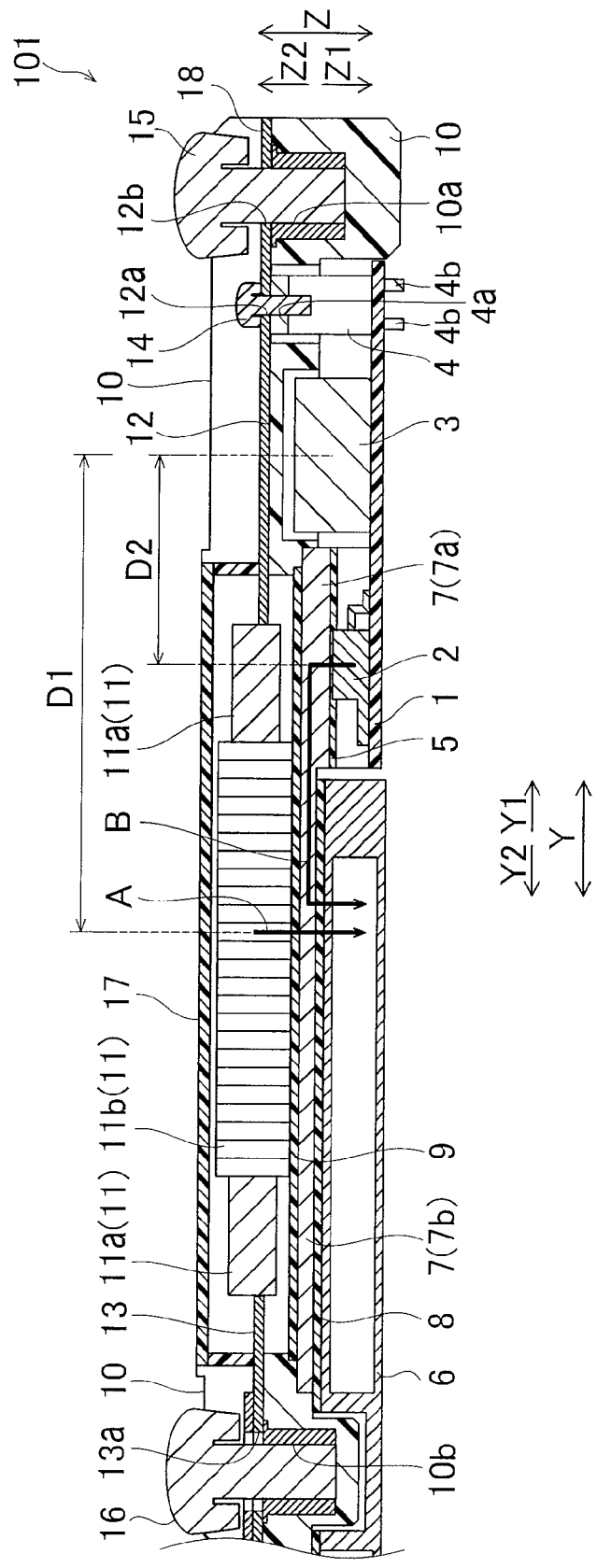
FIG. 8 is a sectional view taken along the line 200-200 in FIG. 6.

As shown in FIG. 8, the thermally conductive sheet 5 having thermal conductivity and elasticity is arranged on surfaces of the resistors 2 in the direction Z2. The elasticity of the thermally conductive sheet 5 can be adjusted by adjusting the amount of silicon contained in the thermally conductive sheet 5. The thermally conductive sheet 5 is an example of the "first thermally conductive member". The resistors 2 are heat generating components generating heat when the filter module 101 operates. The resistors 2 are so arranged as to come into close surface contact with the thermally conductive sheet 5. The resistors 2 are arranged on the side of the cooling jacket 6 in a direction Y1. As shown in FIG. 7, the cooling jacket 6 is arranged not to overlap with the resistors 2 and the condensers 3 as viewed from above (direction Z1).

According to this embodiment, the tabular radiator plate 7 made of metal such as copper is arranged on a surface of the thermally conductive sheet 5, as shown in FIG. 8. This radiator plate 7 is arranged to radiate heat generated from the coils 11 and the resistors 2. According to this embodiment, the radiator plate 7 is in proximity to the resistors 2 through the thermally conductive sheet 5, and so arranged that heat is conducted from the resistors 2 to the radiator plate 7. The radiator plate 7 is an example of the "heat radiating member".

The radiator plate 7 has a first portion 7*a* in the direction Y1 and a second portion 7*b* having a thickness smaller than that of the first portion 7*a* in a direction Y2. The rear surface (in the direction Z1) of the first portion 7*a* of the radiator plate 7 is so arranged as to come into close surface contact with the thermally conductive sheet 5 arranged on the surfaces of the resistors 2. In other words, the first portion 7*a* of the radiator plate 7 is in proximity to the resistors 2 through the thermally conductive sheet 5, and so arranged that heat is conducted from the resistors 2 to the first portion 7*a* of the radiator plate 7. The second portion 7*b* of the radiator plate 7 is in proximity to the coils 11 through the thermally conductive sheet 9, and so arranged that heat is conducted from the coils 11 to the second portion 7*b* of the radiator plate 7.

The heat radiating grease 8 having thermal conductivity and elasticity is applied onto the rear surface (in the direction Z1) of the second portion 7*b* of the radiator plate 7. The heat radiating grease 8 contains silicon or the like, and the elasticity of the heat radiating grease 8 can be adjusted by adjusting the amount of silicon. The rear surface of the second portion 7*b* of the radiator plate 7 is in proximity to a surface of the cooling jacket 6 through the heat radiating grease 8, and so arranged that heat is conducted from the rear surface of the second portion 7*b* of the radiator plate 7 to the cooling jacket 6. The heat radiating grease 8 is an example of the "second thermally conductive member".

Figure 9:
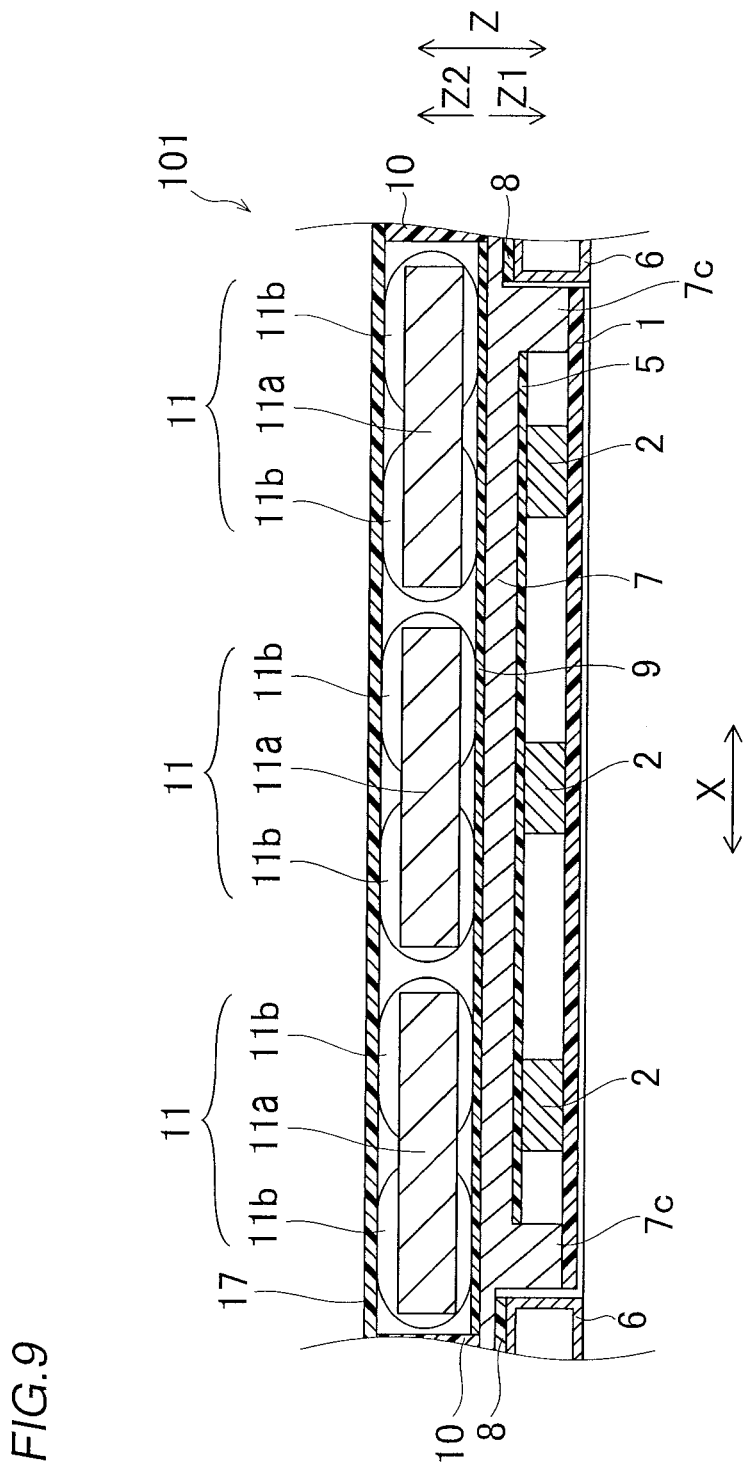
FIG. 9 is a sectional view taken along the line 300-300 in FIG. 6.

As shown in FIG. 9, the radiator plate 7 is formed with protruding portions 7*c* protruding downward (in the direction Z1) from the rear surface of the radiator plate 7. The radiator plate 7 is so arranged as to cover the three resistors 2 arranged on the wiring board 1.

As shown in FIG. 8, the thermally conductive sheet 9 having thermal conductivity and elasticity is arranged on a surface of the radiator plate 7 in the direction Z2. The elasticity of the thermally conductive sheet 9 can be adjusted by adjusting the amount of silicon contained in the thermally conductive sheet 9. The thermally conductive sheet 9 is an example of the "first thermally conductive member". The surface of the radiator plate 7 in the direction Z2 is so arranged as to come into close surface contact with the thermally conductive sheet 9.

Figure 6:
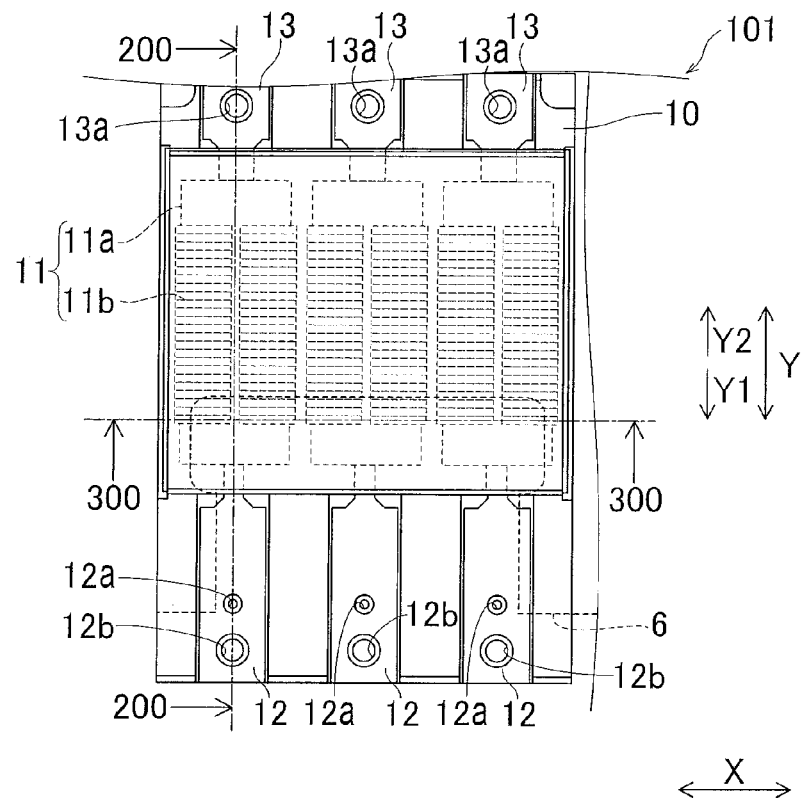
FIG. 6 is a top plan view of the filter module according to the embodiment.

The three coils 11 are heat generating elements generating heat when the filter module 101 operates, and the amount of heat generated from the coils 11 is larger than the amount of heat generated from the resistors 2. As shown in FIGS. 6 and 9, the three coils 11 are arranged at prescribed intervals in a direction X. As shown in FIG. 9, each of the three coils 11 is so arranged as to overlap with each of the three resistors 2.

As shown in FIG. 8, the three coils 11 each are constituted by a rectangular core 11*a* made of metal and conducting wires 11*b* wound on the core 11*a*. The two conducting wires 11*b* are provided on the single core 11*a*, and wound along a direction (direction X) substantially orthogonal to an extensional direction (direction Y) of the core 11*a*. The coils 11 are so arranged as to overlap with the cooling jacket 6 through the thermally conductive sheet 9, the radiator plate 7, and the heat radiating grease 8. The radiator plate 7 is formed over a region where the coils 11 are arranged and a region where the resistors 2 are arranged.

The coils 11 are so arranged as to come into close surface contact with a surface of the thermally conductive sheet 9 in the direction Z2. In other words, the coils 11 are in proximity to the radiator plate 7 through the thermally conductive sheet 9, and so arranged that heat is conducted from the coils 11 to the radiator plate 7. According to this embodiment, heat generated from the coils 11 is conducted mainly in a direction (direction Z) orthogonal to the surface of the radiator plate 7, and heat generated from the resistors 2 is conducted mainly in a direction (direction Y) along the surface of the radiator plate 7. Specifically, heat generated from the coils 11 is conducted to the cooling jacket 6 through the thermally conductive sheet 9, the radiator plate 7 (second portion 7*b*), and the heat radiating grease 8 as a heat conducting path A to be radiated. Heat generated from the resistors 2 is conducted to the cooling jacket 6 through the thermally conductive sheet 5, the radiator plate 7 (first portion 7*a*), and the heat radiating grease 8 as a heat conducting path B to be radiated.

In general, the amount of heat generated from the coils 11 is larger than the amount of heat generated from the resistors 2, and hence it is advisable to radiate heat generated from the coils 11 in preference to heat generated from the resistors 2. In this embodiment, therefore, the length of the heat conducting path A in the radiator plate 7 between the cooling jacket 6 and the coils 11 is smaller than the length of the heat conducting path B in the radiator plate 7 between the cooling jacket 6 and the resistors 2. The condensers 3 are weak against heat, and hence it is advisable to position the condensers 3 as far as possible from the coils 11 generating a large amount of heat. In this embodiment, therefore, the condensers 3 are so arranged on the surface of the wiring board 1 that a distance D1 between the coils 11 and the condensers 3 is larger than a distance D2 between the resistors 2 and the condensers 3. The condensers 3 arranged on the surface of the wiring board 1 are spaced (at prescribed intervals) in the direction Y1 from the radiator plate 7 and the resistors 2.

The platelike busbars 12 made of metal, each serving as an input terminal to input AC power are provided on ends of the coils 11 in the direction Y1. The platelike busbars 13 made of metal, each serving as an output terminal are provided on ends of the coils 11 in the direction Y2. The busbars 12 and 13 are swaged on the cores 11*a* of the coils 11 to be fixedly mounted.

The busbars 12 provided on the side of the coils 11 in the direction Y1 are formed with screw holes 12*a*. The screws 14 are attached to the screw holes 12*a* of the busbars 12 and the screw holes 4*a* of the studs 4, whereby the busbars 12 are fixed to the studs 4. Thus, AC power input into the busbars 12 is supplied to the coils 11 through the busbars 12, and supplied to the condensers 3 and the resistors 2 through the studs 4 and the wiring board 1.

Screw holes 12*b* are formed on ends of the busbars 12 in the direction Y1. The screws 15 are attached to the screw holes 12*b* of the busbars 12 and screw holes 10*a* of the case 10, whereby the busbars 12 are fixed to the case 10. Screw holes 13*a* are formed on ends of the busbars 13 in the direction Y2. The screws 16 are attached to the screw holes 13*a* of the busbars 13 and screw holes 10*b* of the case 10, whereby the busbars 13 are fixed to the case 10. The lid 17 made of resin is attached above the coils 11 (in the direction Z2). The coils 11 are sealed in the case 10 by resin or the like to be electrically insulated from a peripheral electronic component.

Figure 10:
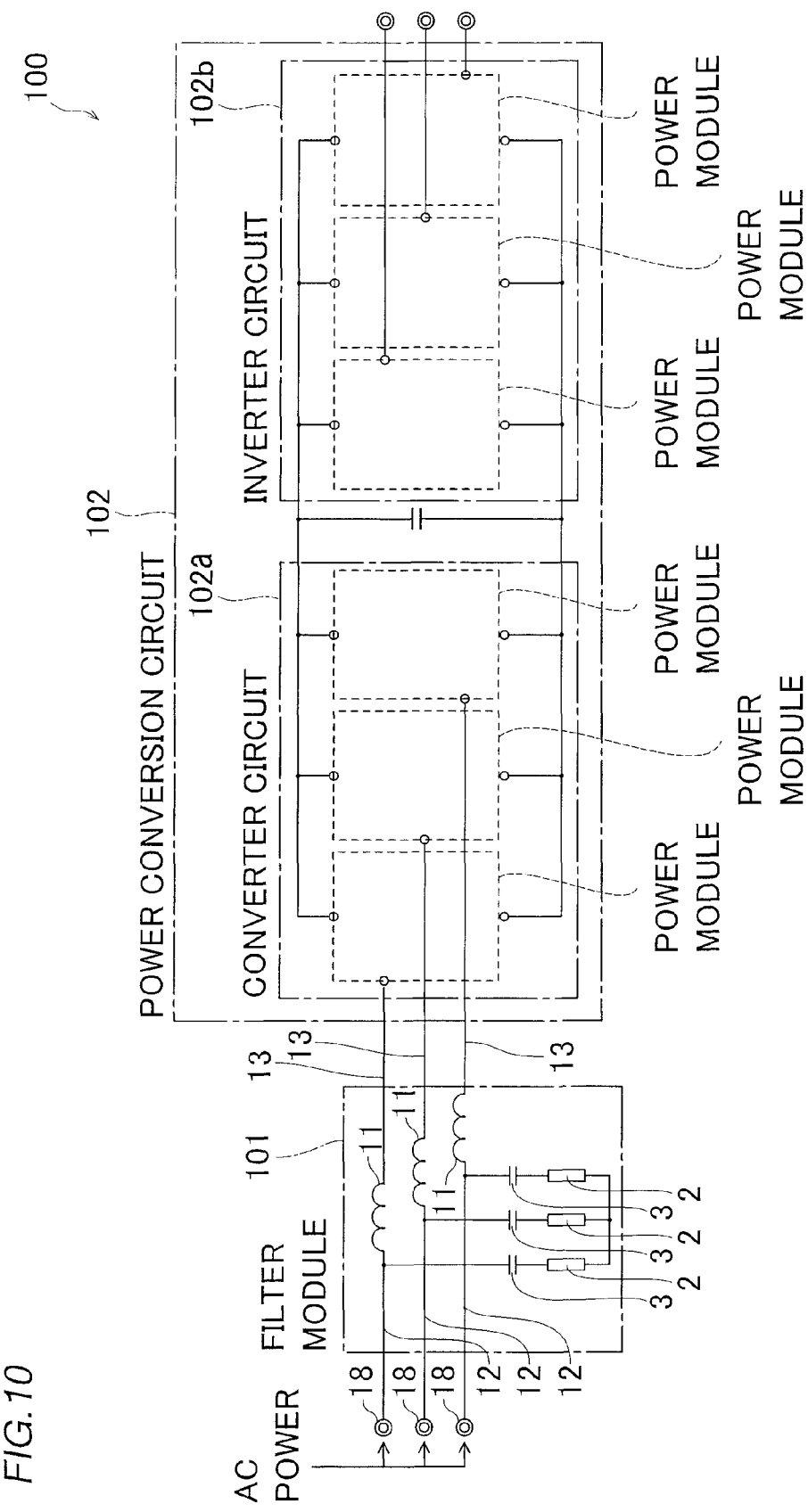
FIG. 10 is a circuit diagram of the power converter according to the embodiment.

Next, the electrical connection relationship in the power converter 100 according to this embodiment is described with reference to FIG. 10.

In the power converter 100, the three busbars 12 serving as input terminals 18 of the filter module 101 are connected to the three coils 11 and the three condensers 3. The three condensers 3 are connected to the three resistors 2. The three resistors 2 are connected to each other.

The three power modules of the converter circuit 102*a* of the power conversion circuit 102 are connected to a stage prior to the three power modules of the inverter circuit 102*b*.

The filter module 101 is connected to a stage prior to the converter circuit 102*a*, and the three busbars 13 serving as output terminals of the filter module 101 are connected to the three power modules of the converter circuit 102*a*.

According to this embodiment, as hereinabove described, the tabular radiator plate 7 made of metal, radiating heat generated from the coils 11 and the resistors 2 is arranged in proximity to the coils 11 and the resistors 2 in indirect contact with the coils 11 and the resistors 2 through the thermally conductive sheets 9 and 5. Thus, heat generated from the coils 11 and the resistors 2 can be conducted to the radiator plate 7 through the thermally conductive sheets 9 and 5. Therefore, heat generated from the heat generating components such as the coils 11 and the resistors 2 can be efficiently radiated by the radiator plate 7. Consequently, heat generated from the heat generating components such as the coils 11 and the resistors 2 can be efficiently radiated by the radiator plate 7 even under a relatively high temperature operating environment. Thus, the reliability of the filter module 101 can be stably retained. Consequently, the reliability of the filter module 101 arranged in the stage prior to the converter circuit 102*a* and the inverter circuit 102*b*, the temperatures of which become relatively high due to inclusion of SiC or GaN can be retained.

According to this embodiment, as hereinabove described, the water-cooling type cooling jacket 6 cooling heat generated from the coils 11 and the resistors 2, conducted to the radiator plate 7 is arranged in indirect contact with the radiator plate 7. Thus, heat conducted to the radiator plate 7 can be conducted to the cooling jacket 6. Consequently, heat generated from the heat generating components such as the coils 11 and the resistors 2 can be efficiently radiated by the cooling jacket 6.

According to this embodiment, as hereinabove described, the length of the heat conducting path A in the radiator plate 7 between the cooling jacket 6 and the coils 11 is smaller than the length of the heat conducting path B in the radiator plate 7 between the cooling jacket 6 and the resistors 2. Thus, heat generated from the coils 11, the amount of which is large as compared with the amount of heat generated from the resistors 2, can be easily conducted to the cooling jacket 6.

According to this embodiment, as hereinabove described, the coils 11 are so arranged as to overlap with the cooling jacket 6 through the radiator plate 7, and the resistors 2 are arranged on the side of the cooling jacket 6. Thus, a conducting path to conduct heat generated from the coils 11 to the cooling jacket 6 and a conducting path to conduct heat generated from the resistors 2 to the cooling jacket 6 can be made different from each other. Consequently, heat generated from the coils 11 and the resistors 2 can be conducted to the cooling jacket 6 through the different conducting paths.

According to this embodiment, as hereinabove described, the radiator plate 7 is formed over the region where the coils 11 are arranged and the region where the resistors 2 are arranged. Thus, heat generated from both the coils 11 and the resistors 2 can be radiated by the single radiator plate 7.

According to this embodiment, as hereinabove described, the condensers 3 are so arranged that the distance between the coils 11 and the condensers 3 is larger than the distance between the resistors 2 and the condensers 3. Thus, heat generated from the coils 11, the amount of which is larger than the amount of heat generated from the resistors 2, is hardly conducted to the condensers 3 weak against heat.

According to this embodiment, as hereinabove described, the coils 11 are arranged in proximity to a first surface of the radiator plate 7, and the resistors 2 are arranged in proximity to a second surface of the radiator plate 7. Thus, heat generated from the coils 11 and the resistors 2 can be suppressed from locally concentrating on either the first surface of the radiator plate 7 or the second surface, and hence heat conducted to the radiator plate 7 can be efficiently radiated.

According to this embodiment, as hereinabove described, the radiator plate 7 includes the first portion 7*a* arranged in proximity to the resistors 2 of the filter circuit and the second portion 7*b* arranged in proximity to the coils 11 of the filter circuit, having a thickness smaller than that of the first portion 7*a*. Thus, the thickness of the first portion 7*a* is larger than the thickness of the second portion 7*b*, and hence the radiation performance of the first portion 7*a* can be rendered larger than that of the second portion 7*b*. Therefore, heat generated from the resistors 2 can be easily radiated through the first portion 7*a*.

According to this embodiment, as hereinabove described, the upper surfaces (surfaces opposite to the wiring board 1) of the resistors 2 are arranged on the lower surface of the radiator plate 7 through the thermally conductive sheet 5. Thus, the wiring board 1 is not arranged between the resistors 2 and the radiator plate 7, and hence heat generated from the resistors 2 can be easily conducted to the radiator plate 7 through the thermally conductive sheet 5.

According to this embodiment, as hereinabove described, the condensers 3 are spaced from the resistors 2 and the radiator plate 7 on the wiring board 1 on which the resistors 2 are arranged. Thus, heat generated from the resistors 2 is hardly conducted to the condensers 3. Furthermore, the condensers 3 are opposed to the coils 11 through the radiator plate 7, and hence conduction of heat generated from the coils 11 to the condensers 3 can be minimized.

According to this embodiment, as hereinabove described, the radiator plate 7 is arranged in proximity to the three coils 11 and the three resistors 2, and so formed as to radiate heat generated from the three coils 11 and the three resistors 2. Thus, heat generated from the three coils 11 and the three resistors 2 can be easily radiated by the radiator plate 7.

According to this embodiment, as hereinabove described, the resistors 2 and the coils 11 are arranged in indirect contact with the radiator plate 7 through the thermally conductive sheet 5 and the thermally conductive sheet 9, respectively. Thus, no air space (noncontact space) is formed between the resistors 2 and the radiator plate 7, and the coils 11 and the radiator plate 7 due to the thermally conductive sheet 5 and the thermally conductive sheet 9 provided therebetween, and hence heat generated from the resistors 2 and the coils 11 can be easily conducted to the radiator plate 7.

According to this embodiment, as hereinabove described, the radiator plate 7 is arranged in indirect contact with the cooling jacket 6 through the heat radiating grease 8. Thus, no air space (noncontact space) is formed between the radiator plate 7 and the cooling jacket 6 due to the heat radiating grease 8 provided therebetween, and hence heat can be easily conducted from the radiator plate 7 to the cooling jacket 6.

According to this embodiment, as hereinabove described, the resistors 2 and the radiator plate 7 are so arranged as to come into close surface contact with the thermally conductive sheet 5 having elasticity, and the coils 11 and the radiator plate 7 are so arranged as to come into close surface contact with the thermally conductive sheet 9 having elasticity. Furthermore, the radiator plate 7 and the cooling jacket 6 are so arranged as to come into close surface contact with the heat radiating grease 8 having elasticity. Thus, the thermally conductive sheet 5 and the thermally conductive sheet 9 both having elasticity can bring the resistors 2 and the radiator plate 7, and the coils 11 and the radiator plate 7 in close contact with each other, even if the surfaces of the resistors 2 and the coils 11 and the surface of the radiator plate 7 are uneven. Consequently, thermal conductivity between the resistors 2 and the radiator plate 7, and the coils 11 and the radiator plate 7 can be improved. Furthermore, the heat radiating grease 8 having elasticity can bring the radiator plate 7 and the cooling jacket 6 in close contact with each other, even if the surface of the radiator plate 7 and the surface of the cooling jacket 6 are uneven. Consequently, thermal conductivity between the radiator plate 7 and the cooling jacket 6 can be improved.

According to this embodiment, as hereinabove described, the filter module 101 is so formed that heat generated from the coils 11 is conducted mainly in the direction Z orthogonal to the surface of the radiator plate 7 while heat generated from the resistors 2 is conducted mainly in the direction Y along the surface of the radiator plate 7. Thus, heat generated from the coils 11 and heat generated from the resistors 2 can be easily conducted to the cooling jacket 6 arranged below the radiator plate 7.

Although the present disclosure has been described and illustrated in detail, it is clearly understood that the same is by way of illustration and example only and is not to be taken by way of limitation, the spirit and scope being limited only by the terms of the appended claims.

Figure 11:
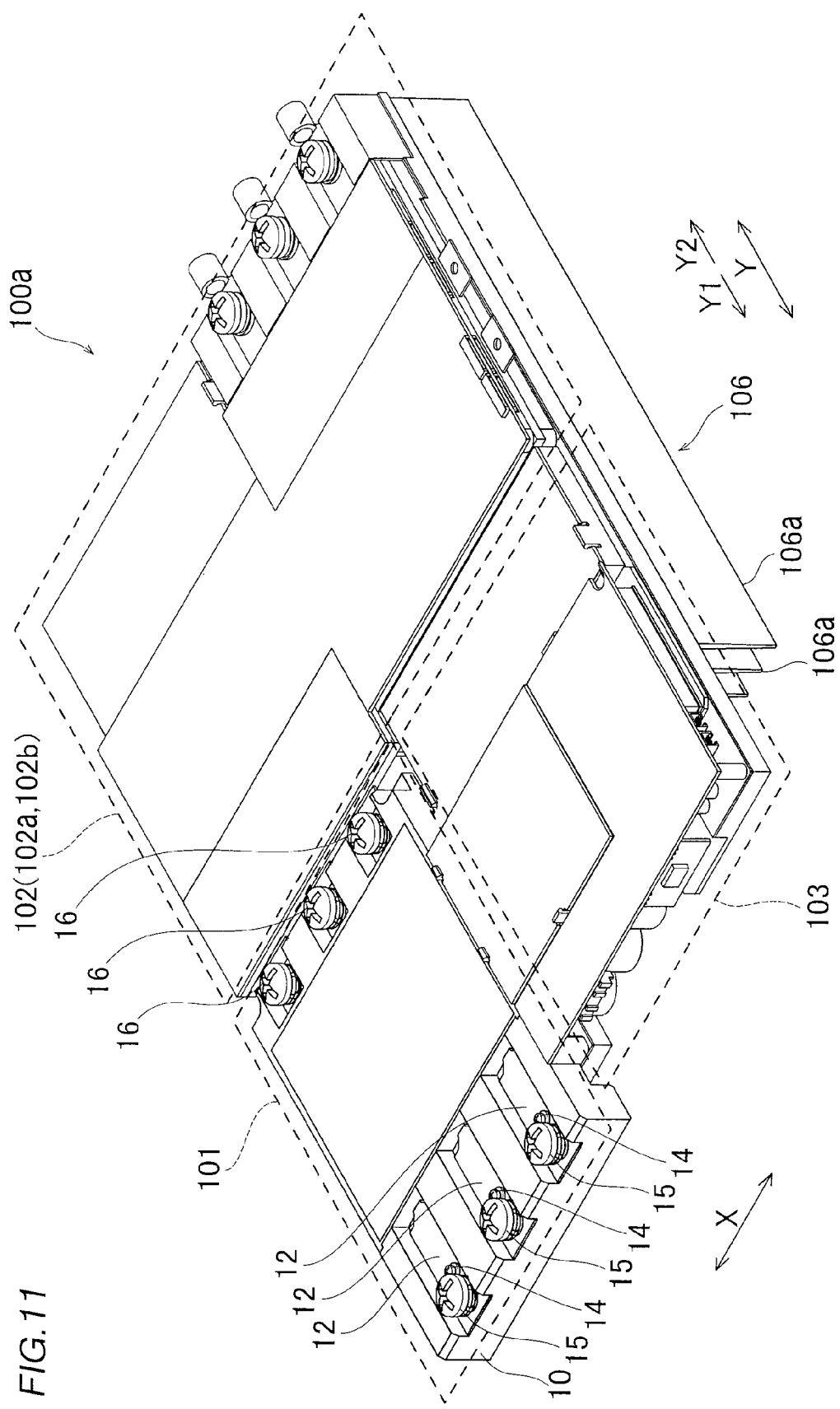
FIG. 11 is a perspective view of a power converter provided with a heat sink having a plurality of fins according to a first modification of the embodiment as viewed from above.
Figure 12:
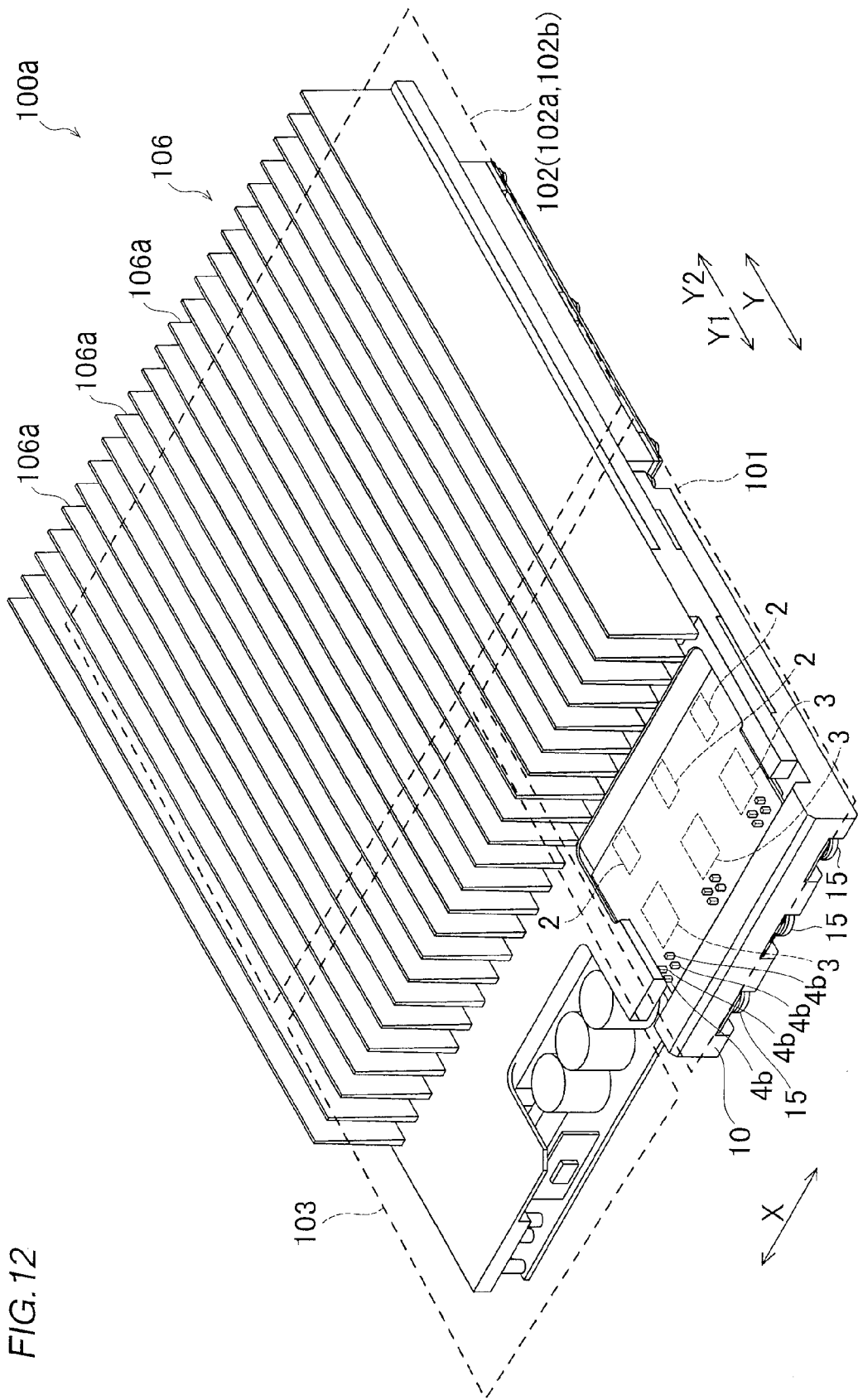
FIG. 12 is a perspective view of the power converter provided with the heat sink having the plurality of fins according to the first modification of the embodiment as viewed from below.

For example, while the water-cooling type cooling jacket 6 is arranged on the rear surface of the radiator plate 7 in the aforementioned embodiment, the embodiment is not restricted to this. For example, an air-cooling type heat sink 106 having a plurality of fins 106*a* extending in a direction Y may alternatively be arranged on the rear surfaces of a filter module 101 and a power conversion circuit 102 of a power converter 100*a*, as in a first modification shown in FIGS. 11 and 12.

While the cooling jacket 6 is arranged on the rear surface of the radiator plate 7 in the aforementioned embodiment, the embodiment is not restricted to this. The cooling jacket 6 or the heat sink 106 may not be arranged on the rear surface of the radiator plate 7, for example. In this case, heat generated from the coils 11 and the resistors 2 can be radiated from the radiator plate 7.

While the radiator plate is arranged in indirect contact with the coils and the resistors through the thermally conductive sheets in the aforementioned embodiment, the embodiment is not restricted to this. The radiator plate may alternatively be arranged in direct contact with the coils and the resistors, for example.

While the thermally conductive sheet containing thermally conductive resin (silicon-based aluminum filler) or the like is applied as an example of the first thermally conductive member in the aforementioned embodiment, the embodiment is not restricted to this. For example, a thermally conductive sheet not containing thermally conductive resin (silicon-based aluminum filler) or the like may alternatively be applied as long as the same is a thermally conductive member. Alternatively, a thermally conductive member other than a thermally conductive sheet can be applied.

While the heat radiating grease having elasticity is applied as an example of the second thermally conductive member in the aforementioned embodiment, the embodiment is not restricted to this. For example, a thermally conductive member such as a heat radiating grease having no elasticity or a thermally conductive sheet can be applied.

While the radiator plate made of copper is arranged in the aforementioned embodiment, the embodiment is not restricted to this. A radiator plate made of aluminum or the like other than copper may alternatively be arranged, for example.

Figure 13:
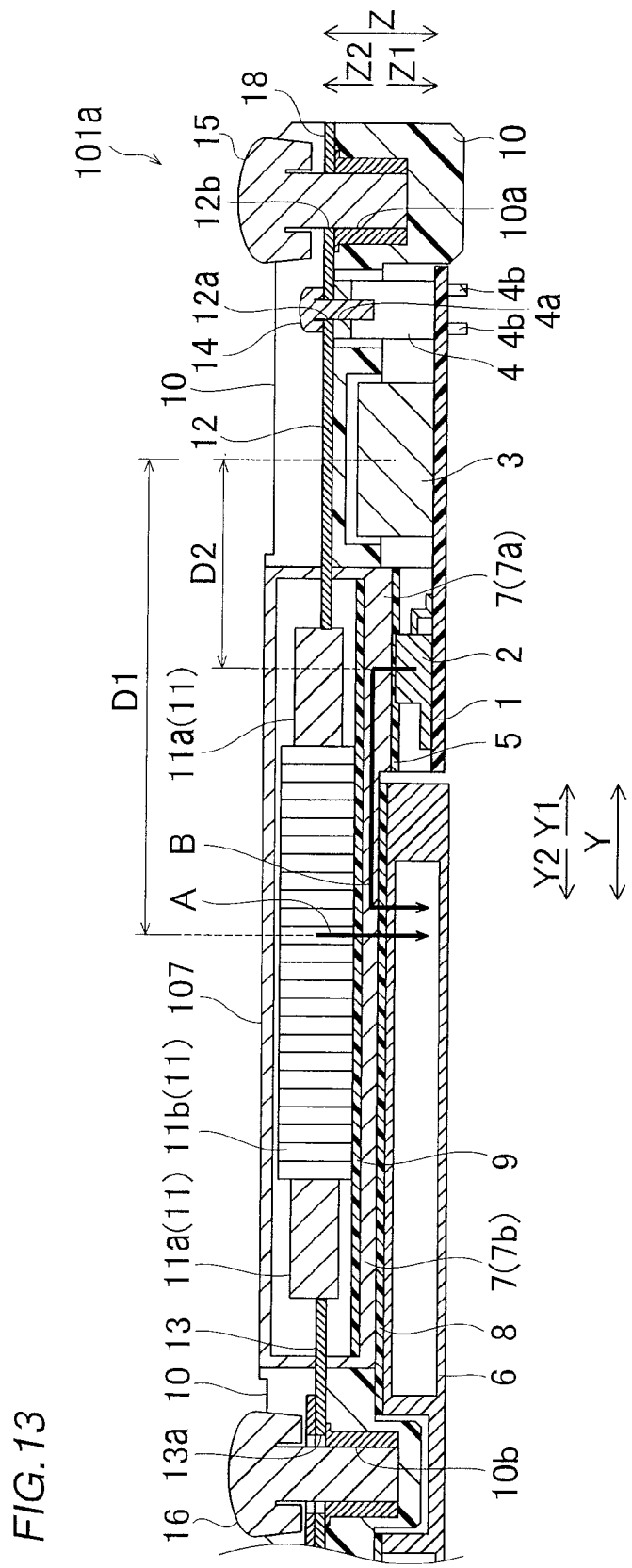
FIG. 13 is a sectional view of a filter module according to a second modification of the embodiment.

While the tabular radiator plate made of metal is arranged in the aforementioned embodiment, the embodiment is not restricted to this. For example, a boxlike radiator plate 107 made of metal may alternatively be formed to cover surroundings of the coils, as in a filter module 101*a* according to a second modification shown in FIG. 13. Thus, the radiator plate 107 covering the surroundings of the coils blocks an electromagnetic wave noise radiated from the coils, and hence influence of the electromagnetic wave noise on the peripheral electronic component can be suppressed. Consequently, reduction in the stability of the operation of the peripheral electronic component can be suppressed.

What is claimed is:
1. A power converter provided with an electronic device, comprising:
    a power conversion circuit; and
    an electronic device arranged in a stage prior to or subsequent to the power conversion circuit, wherein
    the electronic device includes:
        a filter circuit including a coil, a resistor, and a condenser;
        a heat radiating member radiating heat generated from the coil and the resistor, arranged in proximity to the coil and the resistor of the filter circuit; and
        a cooling portion cooling heat generated from the coil and the resistor of the filter circuit and conducted to the heat radiating member, arranged in proximity to the heat radiating member, wherein a length of a heat conducting path in the heat radiating member between the cooling portion and the coil is smaller than a length of a heat conducting path in the heat radiating member between the cooling portion and the resistor.

2. The power converter according to claim 1, wherein
the coil of the filter circuit is so arranged as to overlap with the cooling portion through the heat radiating member, and
the resistor of the filter circuit is arranged on a side of the cooling portion.

3. The power converter according to claim 1, wherein
the heat radiating member is formed over a region where the coil is arranged and a region where the resistor is arranged.

4. A power converter provided with an electronic device, comprising:
a power conversion circuit; and
an electronic device arranged in a stage prior to or subsequent to the power conversion circuit, wherein
the electronic device includes:
a filter circuit including a coil, a resistor, and a condenser; and
a heat radiating member radiating heat generated from the coil and the resistor, arranged in proximity to the coil and the resistor of the filter circuit, wherein
the condenser of the filter circuit is so arranged that a distance between the coil and the condenser is larger than a distance between the resistor and the condenser.

5. A power converter provided with an electronic device, comprising:
a power conversion circuit; and
an electronic device arranged in a stage prior to or subsequent to the power conversion circuit, wherein
the electronic device includes:
a filter circuit including a coil, a resistor, and a condenser; and
a heat radiating member radiating heat generated from the coil and the resistor, arranged in proximity to the coil and the resistor of the filter circuit, wherein
the coil of the filter circuit is arranged in proximity to a first surface of the heat radiating member, and
the resistor of the filter circuit is arranged in proximity to a second surface of the heat radiating member.

6. The power converter according to claim 5, wherein
the heat radiating member includes a first portion arranged in proximity to the resistor of the filter circuit and a second portion arranged in proximity to the coil of the filter circuit, having a thickness smaller than a thickness of the first portion.

7. The power converter according to claim 5, wherein
the resistor of the filter circuit is provided on a wiring board, and
a surface of the resistor opposite to the wiring board is arranged in proximity to the second surface of the heat radiating member.

8. The power converter according to claim 7, wherein
the condenser is spaced from the resistor and the heat radiating member on the wiring board on which the resistor is arranged.

9. A power converter provided with an electronic device, comprising:
a power conversion circuit; and
an electronic device arranged in a stage prior to or subsequent to the power conversion circuit, wherein
the electronic device includes:
a filter circuit including a coil, a resistor, and a condenser; and
a heat radiating member radiating heat generated from the coil and the resistor, arranged in proximity to the coil and the resistor of the filter circuit, wherein
the filter circuit includes a plurality of the coils and a plurality of the resistors, and
the heat radiating member is arranged in proximity to the plurality of coils and the plurality of resistors, and so formed as to radiate heat generated from the plurality of coils and the plurality of resistors.

10. The power converter according to claim 1, further comprising a first thermally conductive member provided between either the coil or the resistor of the filter circuit and the heat radiating member or between each of the coil and the resistor of the filter circuit and the heat radiating member, wherein
either the coil or the resistor, or each of the coil and the resistor is arranged in proximity to the heat radiating member through the first thermally conductive member.

11. The power converter according to claim 10, further comprising:
a cooling portion cooling heat generated from the coil and the resistor of the filter circuit and conducted to the heat radiating member; and
a second thermally conductive member provided between the heat radiating member and the cooling portion, wherein
either the coil or the resistor, or each of the coil and the resistor is arranged in proximity to the cooling portion through the heat radiating member and the second thermally conductive member.

12. The power converter according to claim 11, wherein
the first thermally conductive member and the second thermally conductive member have elasticity, and
either the coil or the resistor and the heat radiating member, or each of the coil and the resistor and the heat radiating member are so arranged as to come into close surface contact with the first thermally conductive member having elasticity, and the heat radiating member and the cooling portion are so arranged as to come into close surface contact with the second thermally conductive member having elasticity.

13. The power converter according to claim 12, wherein
the first thermally conductive member includes a thermally conductive sheet having elasticity, and the second thermally conductive member includes a heat radiating grease having elasticity.

14. The power converter according to claim 1, wherein
the heat radiating member includes a tabular radiator plate made of metal.

15. The power converter according to claim 14, wherein
heat generated from the coil is conducted mainly in a direction orthogonal to a surface of the heat radiating member, and heat generated from the resistor is conducted mainly in a direction along the surface of the heat radiating member.

16. The power converter according to claim 1, wherein
the heat radiating member is so formed as to cover surroundings of the coil.

17. A power converter provided with an electronic device, comprising:
a power conversion circuit; and
an electronic device arranged in a stage prior to or subsequent to the power conversion circuit, wherein
the electronic device includes:

a filter circuit including a coil, a resistor, and a condenser;

a heat radiating member radiating heat generated from the coil and the resistor, arranged in proximity to the coil and the resistor of the filter circuit; and a cooling portion cooling heat generated from the coil and the resistor of the filter circuit and conducted to the heat radiating member, arranged in proximity to the heat radiating member, wherein the cooling portion includes a water-cooling type cooling jacket or a heat sink having a plurality of fins.

* * * * *